United States Patent
Yoshiyama

(10) Patent No.: US 6,560,147 B2
(45) Date of Patent: May 6, 2003

(54) SEMICONDUCTOR DEVICE HAVING SCAN TEST CIRCUIT THAT SWITCHES CLOCK SIGNAL BETWEEN SHIFT MODE AND CAPTURE MODE, AND METHOD OF TESTING THE SEMICONDUCTOR DEVICE

(75) Inventor: Masayuki Yoshiyama, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/101,367

(22) Filed: Mar. 20, 2002

(65) Prior Publication Data

US 2002/0136064 A1 Sep. 26, 2002

(30) Foreign Application Priority Data

Mar. 26, 2001 (JP) ......................................... 2001-087702

(51) Int. Cl.⁷ .............................. G11C 16/04; G11C 7/00
(52) U.S. Cl. .................................. 365/189.05; 365/201
(58) Field of Search ............................ 365/189.05, 201, 365/240, 189.12; 714/718

(56) References Cited

U.S. PATENT DOCUMENTS

| | | | | | |
|---|---|---|---|---|---|
| 5,281,864 | A | * | 1/1994 | Hahn et al. | 327/202 |
| 5,533,032 | A | * | 7/1996 | Johnson | 714/733 |
| 5,900,753 | A | * | 5/1999 | Cote et al. | 327/145 |
| 6,446,230 | B1 | * | 9/2002 | Chung | 714/726 |

* cited by examiner

*Primary Examiner*—Michael S. Lebentritt
*Assistant Examiner*—Anh Phung
(74) *Attorney, Agent, or Firm*—Oliff & Berridge, PLC

(57) ABSTRACT

In one of a digital circuit and a semiconductor device, each having a scan chain, a clock fed to a clock input terminal of a flipflop forming the scan chain is switched between during a shift mode and during a capture mode. The time interval from the last clock pulse of the clock signal selected during the shift mode to the first clock pulse of the clock signal selected during the capture mode is set to be shorter than the pulse interval (period) between adjacent pulses of the clock signal selected during the shift mode. In this arrangement, a low-speed tester operates at a substantially high speed, permitting scan-path testing to be carried out with low cost involved.

13 Claims, 6 Drawing Sheets

US 6,560,147 B2

SEMICONDUCTOR DEVICE HAVING SCAN TEST CIRCUIT THAT SWITCHES CLOCK SIGNAL BETWEEN SHIFT MODE AND CAPTURE MODE, AND METHOD OF TESTING THE SEMICONDUCTOR DEVICE

BACKGROUND OF THE INVENTION

1. Field of the Invention

The present invention relates to a digital circuit having a scan test circuit and, in particular, to a semiconductor device incorporating the scan test circuit.

2. Description of the Related Art

A scan-path testing method is known as a test facilitating technique for a semiconductor device. Flipflops in a sequential circuit in a semiconductor device are arranged to be a shift register that can be scanned (a shift register formed of a plurality of flipflops is referred to as a scan chain). In the scan-path testing method, test data is fed to an internal circuit (a combination circuit) by the flipflops while data is shifted through the shift register, and then, the shift register captures data from the internal circuit and shifts and outputs the data. In this way, the test is facilitated.

FIG. 8 shows a portion of a scan test circuit incorporated into a conventional semiconductor device.

A scan test circuit 1 shown in FIG. 8 includes selectors 12_1 through 12_4, and flipflops 10_1 through 10_4. Although scan test circuits typically include a number of selectors and flipflops, the scan test circuit 1 here includes four selectors and four flipflops for simplicity of explanation.

FIG. 8 also shows an internal circuit (a combination circuit) 11 which is tested by the scan test circuit 1.

Each of the flipflops 10_1 through 10_4 in the scan test circuit 1 has a clock input terminal K, a data input terminal D, and a data output terminal Q.

Each of the selectors 12_1 through 12_4 in the scan test circuit 1 has two data input terminals "0" and "1", a data output terminal, and a select terminal that receives a scan enable signal SE to be discussed later.

The terminals "0" of the selectors 12_1 and 12_2 are connected to the internal circuit (not shown). The terminal "1" of the selector 12_1 is connected to an SIN (Serial In) terminal. The terminal "1" of the selector 12_2 is connected to the data output terminal Q of the flipflop 10_1.

The terminals "0" of the selectors 12_3 and 12_4 are connected to the internal circuit 11. The output terminals of the selectors 12_1 through 12_4 are respectively connected to the data input terminals D of the flipflops 10_1 through 10_4. Each clock input terminal K of the flipflops receives a clock CLK from outside the scan test circuit 1.

The data output terminals Q of the flipflops 10_1 and 10_2 are respectively connected to the internal circuit 11. The data output terminal Q of the flipflop 10_1 is also connected to the terminal "1", of the selector 12_2. The data output terminal of the flipflop 10_2 is also connected to the terminal "1" of the selector 12_3. The data output terminal Q of the flipflop 10_3 is connected to the terminal "1" of the selector 12_4 and the internal circuit (not shown). The data output terminal Q of the flipflop 10_4 is connected to an SOUT (Serial Out) terminal discussed later and the internal circuit (not shown).

The scan test circuit 1 is set to be in a shift mode when the SE signal input to the selectors 12_1 through 12_4 remains at a high level. The scan test circuit 1 is set to be in a capture mode when the SE signal remains at a low level.

FIG. 9 is a timing diagram of the clock CLK and the SE signal input to the scan test circuit 1 shown in FIG. 8.

FIG. 9 illustrates the SE signal that is transitioned from a high level to a low level, and from a low level to a high level, and clock pulses T1 through T5 of the clock CLK in the order of occurrence.

With the SE signal at a high level as illustrated in FIG. 9, clock pulses T1 and T2 are generated, and with the SE signal at a low level, clock pulse T3 is generated. With the SE signal returning to a high level, clock pulses T4 and T5 are generated.

The procedure of the scan test using the scan test circuit 1 will now be explained. Referring to FIG. 9, in a state (the shift mode) during which a high-level SE signal is being input to the selectors 12_1 through 12_4 in the scan test circuit 1, test data is sent to the flipflops 10_1 through 10_4 through the selectors 12_1 through 12_4 at the timing of the rising edge of each of the clock pulses T1 and T2. The data that is sent to the flipflops 10_1 and 10_2 is also sent to the internal circuit 11.

In a state (the capture mode) during which a low-level SE signal is being input to the selectors 12_1 through 12_4 in the scan test circuit 1, the flipflops 10_3 and 10_4 capture the data, which has passed through the internal circuit 11, at the timing of the rising edge of the clock pulse T3 shown in FIG. 9.

In a state during which a high-level SE signal is being input to the selectors 12_1 through 12_4 again, the data captured by the flipflops 10_3 and 10_4 from the internal circuit 11 is successively shifted at the timing of the rising edge of each of the clock pulses T4 and T5 illustrated in FIG. 9.

The data shifted out from the flipflop 10_4 is sent out through the SOUT (Serial Out) terminal illustrated in FIG. 8. The data shifted out and the expected data are compared with each other to see if the internal circuit 11 operates normally.

The scan-path testing is thus performed on the internal circuit 11 as an object to be tested.

In step with high-speed operation, fine-line design and multi-layer wiring structure of current semiconductor devices, the probability of occurrence of signal delays due to high resistance arising from contact failure of contact holes (via holes) increases.

There is a pressing need for the scan-path testing in the high-speed operation environment to detect a signal delay failure taking place in an internal circuit.

To perform a scan-path test in a semiconductor device at a high speed in a high-speed operation environment, an expensive high-speed tester is required. This increases test costs.

SUMMARY OF THE INVENTION

Accordingly, it is an object of the present invention to provide a semiconductor device and a digital circuit, each including a scan test circuit which can perform a scan-path test at an operational environment higher in speed than the currently available environment while involving less test costs.

It is another object of the present invention to provide a method of testing a semiconductor device and a digital circuit with the semiconductor device and the digital circuit operated at a speed higher than that of a clock input from outside, by using a tester which generates a clock lower than the operational speed of the semiconductor device and the digital circuit.

To achieve the above objects, each of a semiconductor device and a digital circuit in one aspect of the present invention includes a scan chain including a plurality of pairs of a selector and a flipflop arranged in cascade, the scan chain performing a capture mode in which in response to a scan enable signal the flipflop captures data from an internal circuit in synchronization with a predetermined clock and a shift mode in which in response to the scan enable signal, one of the data stored in the flipflop and test data input from outside is shifted to a subsequent flipflop in synchronization with the predetermined clock, a clock generator which generates a clock signal in response to one of the rising edge and the falling edge of the clock pulse of another clock signal input from outside as a trigger, and a clock selector which receives the clock signal input from outside and the clock signal generated by the clock generator, and selects one of the two clock signals in response to the scan enable signal for switching between the shift mode and the capture mode, and then feeds the selected clock signal to the clock input terminal of at least one flipflop forming the scan chain.

Preferably, the clock generator generates a clock having one of the falling edge and the rising edge thereof coinciding with one of the rising edge and the falling edge of the clock signal input from outside.

Preferably, the clock generator generates a clock having one of the falling edge and the rising edge thereof delayed by a predetermined time from the timing of one of the rising edge and the falling edge of the clock signal input from outside.

A method of testing each of the semiconductor device and the digital circuit in another aspect of the present invention includes the steps of inputting the clock signal input from outside to the semiconductor device using a tester, and switching between the shift mode and the capture mode in response to the scan enable signal to test each of the semiconductor device and the digital circuit.

In each of the semiconductor device and the digital circuit of the present invention, the time interval from the last clock pulse of the clock signal selected in the shift mode to the first clock pulse of the clock signal selected in the capture mode when the shift mode is switched to the capture mode is set to be shorter than the pulse interval between adjacent pulses of the clock signal selected during the shift mode. The duration of time from the sending of data to an internal circuit to the capturing of data that has passed through the internal circuit is shorter than the time interval of the clock pulse supplied from a tester in use. A delay failure occurring in the internal circuit is thus detected using a low-cost tester when the internal circuit is operated at a speed higher than the highest frequency clock of the tester.

DESCRIPTION OF THE PREFERRED EMBODIMENTS

Figure 1:
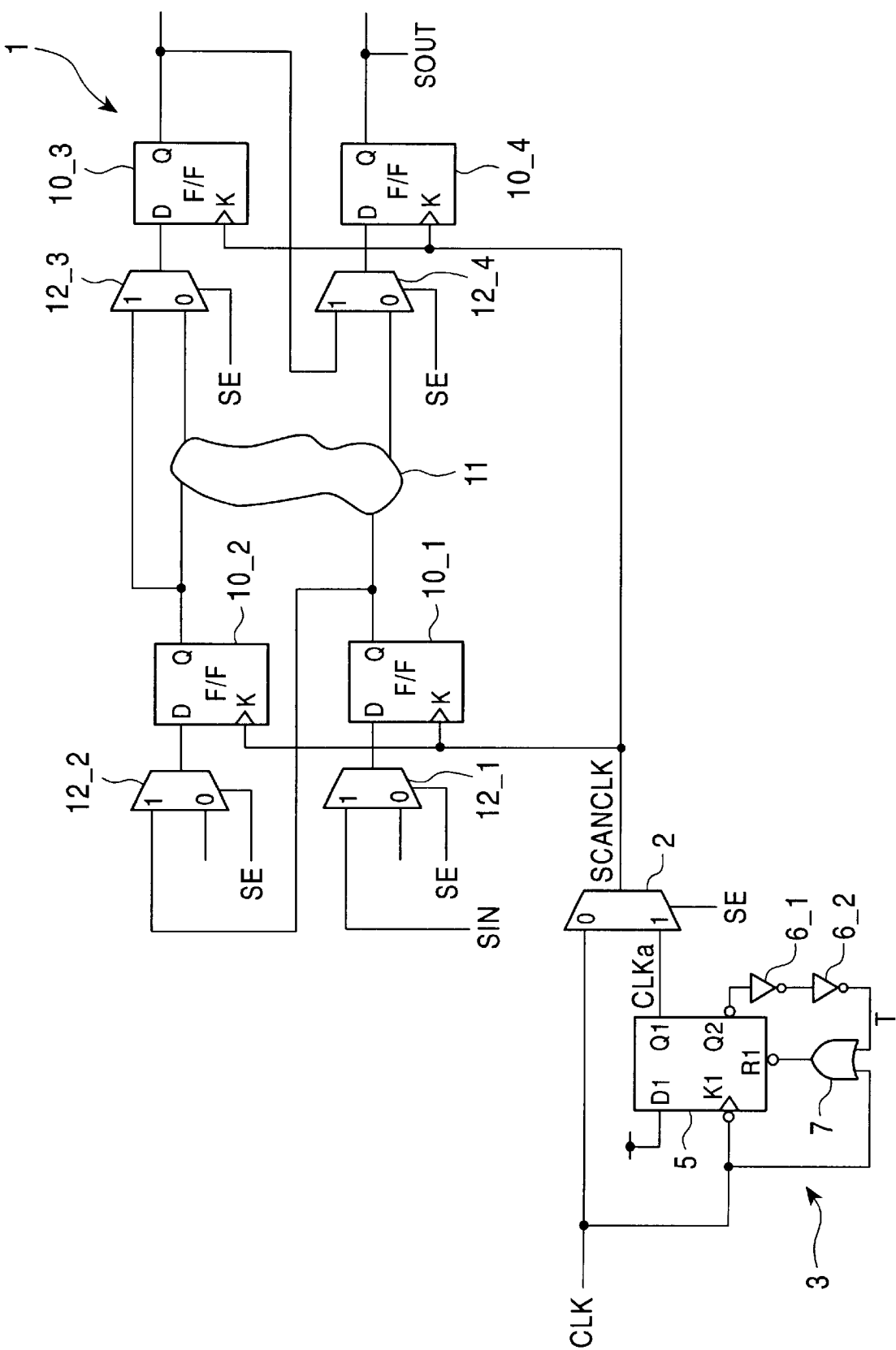
FIG. 1 illustrates a portion of a semiconductor device in accordance with one embodiment of the present invention.

The embodiments of the present invention will now be described referring to the drawings.

FIG. 1 illustrates a portion of a semiconductor device in accordance with one embodiment of the present invention.

Figure 8:
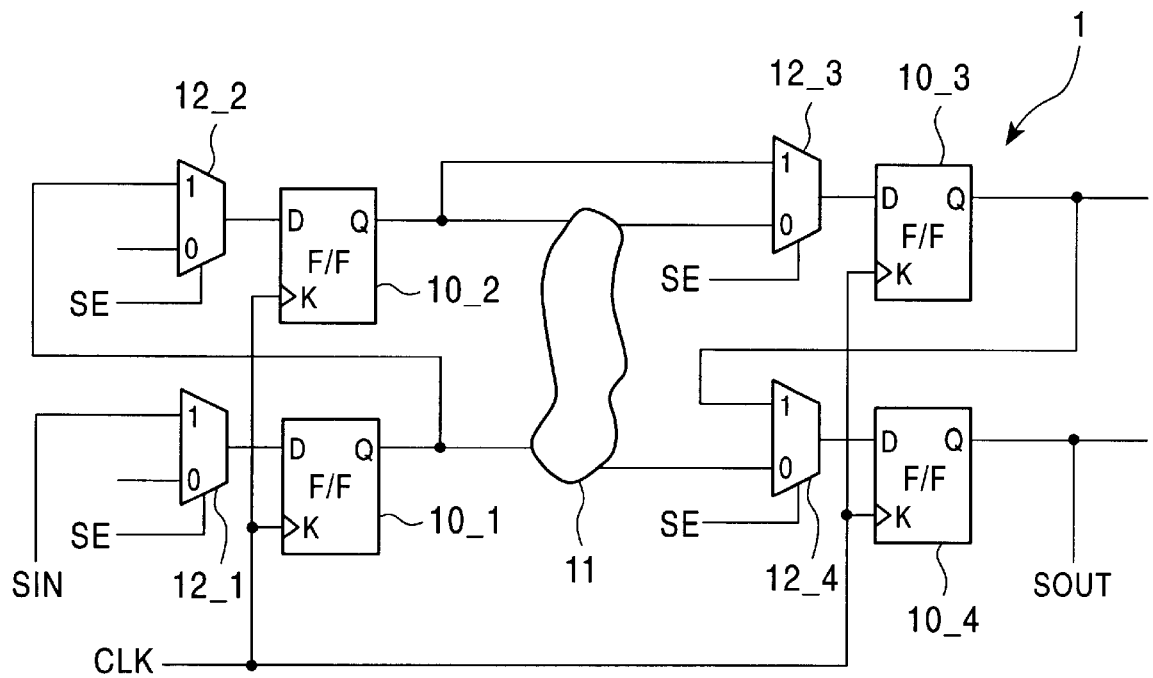
FIG. 8 illustrates a portion of a scan test circuit incorporated in a conventional semiconductor device.

Referring to FIG. 1, the semiconductor device includes a portion of a scan test circuit 1, a clock selector 2, a clock generator 3, and an internal circuit 11 to be tested by the scan test circuit 1. The scan test circuit 1 remains identical to the conventional scan test circuit 1 shown in FIG. 8, and the explanation of a portion common to both circuits is omitted here.

Figure 9:
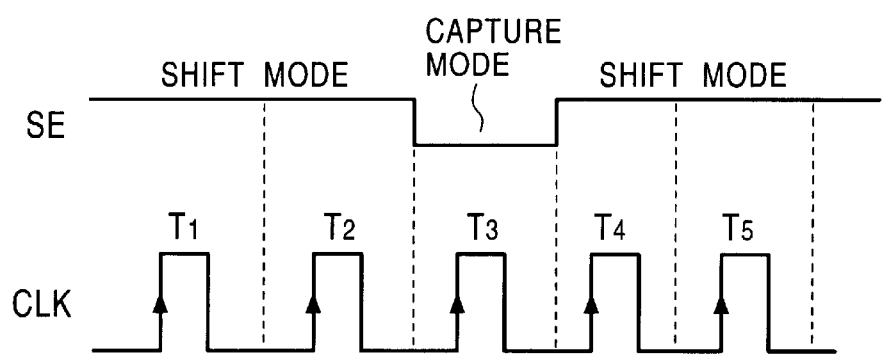
FIG. 9 is a timing diagram illustrating the timings of a clock and a scan enable signal in the scan test circuit illustrated in FIG. 8.

The clock selector 2 receives a clock CLK identical to the clock CLK shown in FIG. 9, and a clock a (also designated CLKa) which has a rising edge coinciding with the falling edge of the clock pulse CLK, and which is generated by the clock generator 3. The clock selector 2 also receives at the select terminal thereof an SE signal for switching the scan test circuit 1 between a shift mode and a capture mode.

The clock selector 2 receives the clock a at the terminal "1" thereof, and the clock CLK at the terminal "0" thereof, thereby selecting the clock a when a high-level SE signal is input thereto, and selecting the clock CLK when a low-level SE signal is input thereto. The clock (hereinafter referred to as a scan clock or a SCANCLK) input to the clock input terminals of the flipflops 10_1 through 10_4 from the clock selector 2 becomes the CLKa during the shift mode and the clock CLK during the capture mode.

The clock generator 3 includes a flipflop 5, two inverters 6_1 and 6_2, and an OR gate 7.

A flipflop 5 in the clock generator 3 has a clock input terminal K1, an input terminal D1, output terminals Q1 and Q2, and a reset terminal R1.

The clock input terminal K1 of the flipflop 5 receives the clock CLK input from outside. The flipflop 5 operates at the falling edge of the clock CLK. The input terminal D1, connected to a power supply, always receives a high-level voltage. The output terminal Q1, connected to the terminal "1" of the clock selector 2, outputs the clock CLKa. The output terminal Q2 is connected to an input terminal of the OR gate 7 through inverters 6_1 and 6_2. The output terminal Q2 outputs an inverted version of the signal output from the output terminal Q1. The output of the OR gate 7 is connected to the reset terminal R1 of the flipflop 5. Upon receiving the falling edge of the signal output from the OR gate 7 at the reset terminal R1, the flipflop 5 is reset.

Figure 2:
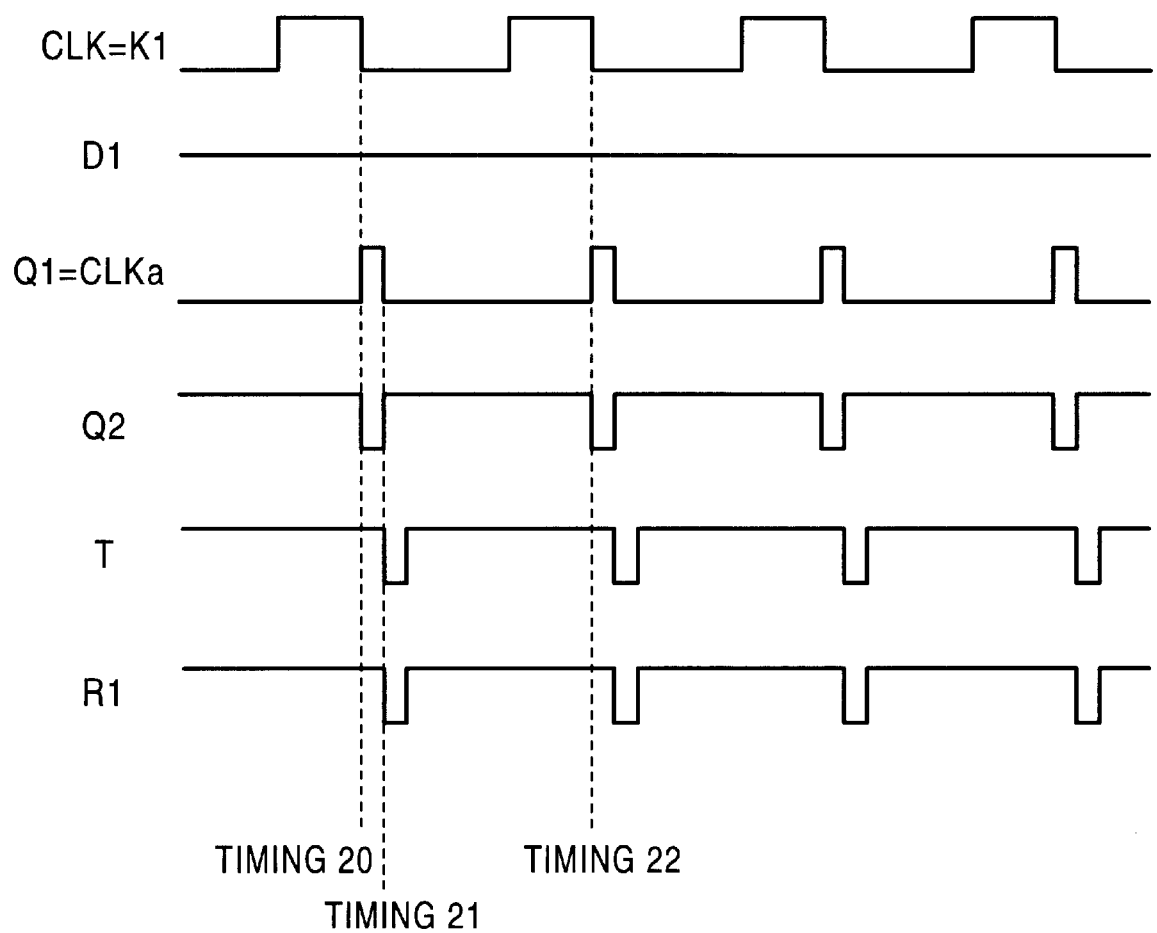
FIG. 2 is a timing diagram illustrating the timings of signals in terminals of a flipflop in a clock generator shown in FIG. 1.

FIG. 2 is a timing diagram illustrating the timings of signals at the terminals of the flipflop 5.

Referring to FIG. 2, there are shown the clock CLK input to the clock input terminal of the flipflop 5, the signal input to the input terminal D1 of the flipflop 5, the signal output from the output terminal Q2 of the flipflop 5, the signal (designated T in FIG. 2) input to the OR gate 7, and the signal input to the reset terminal R1 of the flipflop 5.

The generation of the clock a in the clock generator 3 shown in FIG. 1 is described below.

A high-level signal at the input terminal D1 is output from the output terminal Q1 at a timing 20 of the falling edge of the clock CLK shown in FIG. 2. At the same moment, the flipflop 5 outputs, at the output terminal Q2, a low-level signal which is an inverted version of the signal output from the output terminal Q1. After passing through the two inverters 6_1 and 6_2, a signal (designated T in FIG. 2) input to the OR gate 7 is delayed from the signal output from the output terminal Q2. The signal output to the reset terminal R1 from the OR gate 7 is driven low at a timing 21, and at the same moment, the flipflop 5 is reset. The signal output from the output terminal Q1, which was at a high level, is driven low at the timing 21. At a timing 22 of the falling edge of the next clock CLK, the high-level signal input to the input terminal D1 is output again from the output terminal Q1. The above operation is repeated, thereby generating the clock a.

Figure 3:
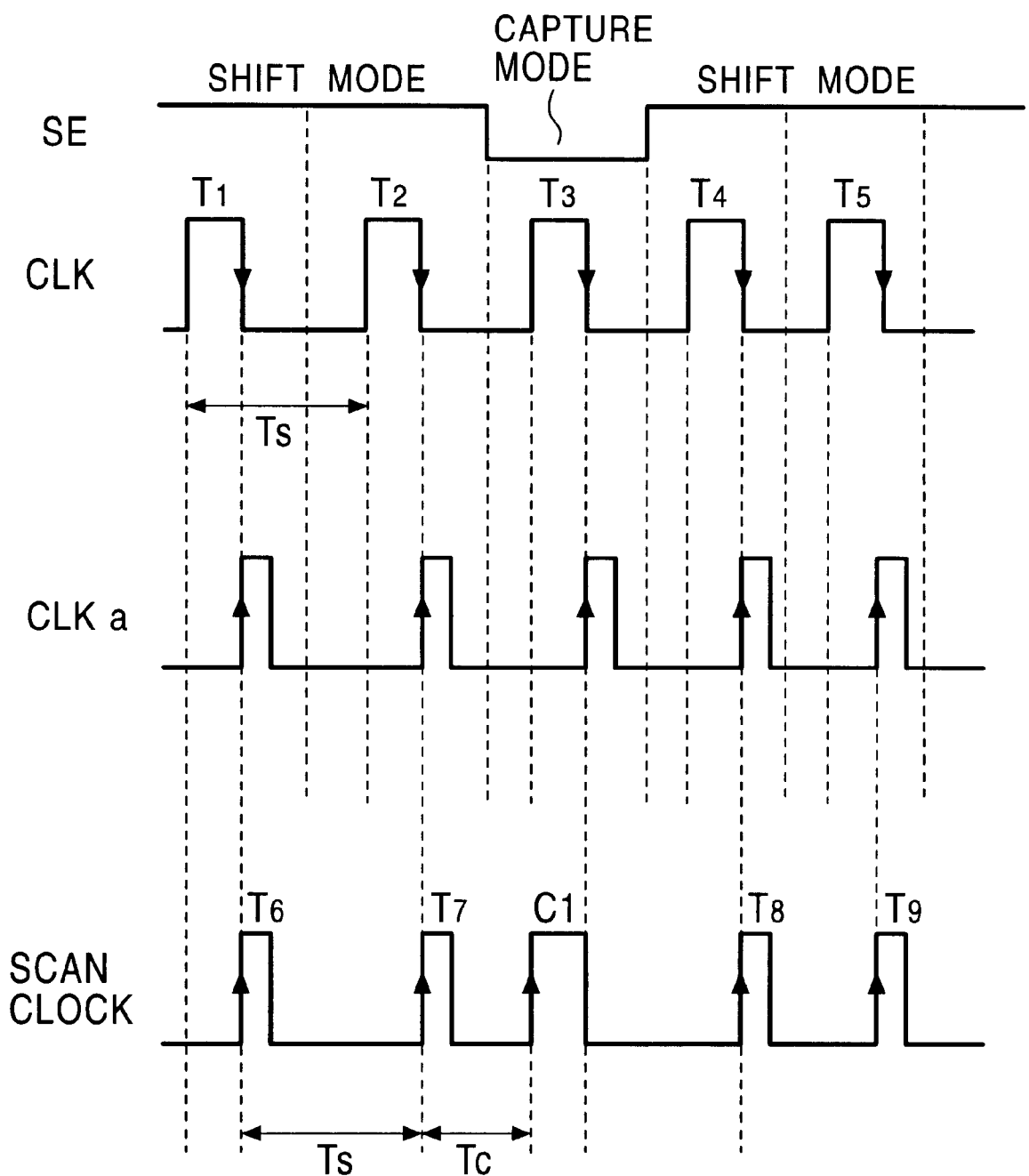
FIG. 3 is a timing diagram showing an SE signal, a clock CLK, a clock a, and a scan clock.

FIG. 3 is a timing diagram showing the SE signal, the clocks CLK and CLKa, and the scan clock.

Referring to FIG. 3, there are shown the clock CLKa which is generated by the clock generator 3 in synchronization with the timing illustrated in FIG. 2, and the scan clock that is selected by the clock selector 2 in response to the SE signal and fed to the scan test circuit 1. Clock pulses T6, T7, C1, T8, and T9 of the scan clock are shown in the order of occurrence in FIG. 3.

Referring to FIG. 3, clock pulses T6 and T7 are selected as the scan clock in the shift mode with the SE signal at a high level. Clock pulse C1 is selected as the scan clock in the capture mode with the SE signal at a low level. Clock pulses T8 and T9 are selected with the SE signal returned to a high level again.

When the scan test circuit 1 performs a scan test, the high-level SE signal shown in FIG. 3 is input to the selectors 12_1 through 12_4 and the clock selector 2. The scan test circuit 1 is switched to the shift mode, and the clock selector 2 selects the clock a, thereby successively feeding clock pulses T6 and T7 to the clock input terminals of the flipflops 10_1 through 10_4.

Test data is successively sent to the flipflops 10_1 through 10_4 at the timing of rising edge of each of the clock pulses T6 and T7. The test data is then fed to the internal circuit 11. The scan test circuit 1 feeds the test data to the internal circuit 11 at the timing of the rising edge of the clock pulse T7, thereby completing the setting of the test data to the internal circuit 11. Referring to FIG. 3, a duration of time from the rising edge of the clock pulse T6 to the rising edge of the clock pulse T7 is designated Ts.

The low-level SE signal is then input to the selectors 12_1 through 12_4 in the scan test circuit 1 and the clock selector 2. In response, the shift mode is switched to the capture mode. The clock selector 2 selects the clock CLK, thereby feeding the clock pulse C1 to the flipflops 10_1 through 10_4 at the clock input terminals thereof. Data that has passed through the scan test circuit 1 is captured in parallel by the flipflops 10_3 and 10_4 at the timing of the rising edge of the clock pulse C1. A duration of time from the rising edge of the clock pulse T7 to the rising edge of the clock pulse C1 is designated Tc.

The time duration Tc is set to be shorter than the time duration Ts, namely, the period of the clock CLK from the rising edge of the clock pulse T6 to the rising edge of the clock pulse T7.

When the SE signal is transitioned from a low level to a high level, the scan test circuit 1 is switched from the capture mode back to the shift mode. At the same time, the clock selector 2 selects the clock a, thereby successively feeding clock pulses T8 and T9 shown in FIG. 3 to the clock input terminals of the flipflops 10_1 through 10_4. The data captured by flipflops 10_3 and 10_4 from the internal circuit 11 is shifted out from the terminal SOUT at the timing of the rising edge of each of clock pulses T8 and T9.

The data thus shifted out and the expected data are compared to each other to determine whether the internal circuit 11 operates normally.

Specifically, the scan test circuit 1 sets the test data to the internal circuit 11 and captures the data that has passed through the internal circuit 11 at the time interval Tc, which is shorter than the period Ts of the clock CLK input from outside.

Using a low-speed tester, a delay failure generated in the internal circuit 11 is detected with the internal circuit 11 operated at a speed higher than the maximum frequency of the clock of the tester.

Figure 4:
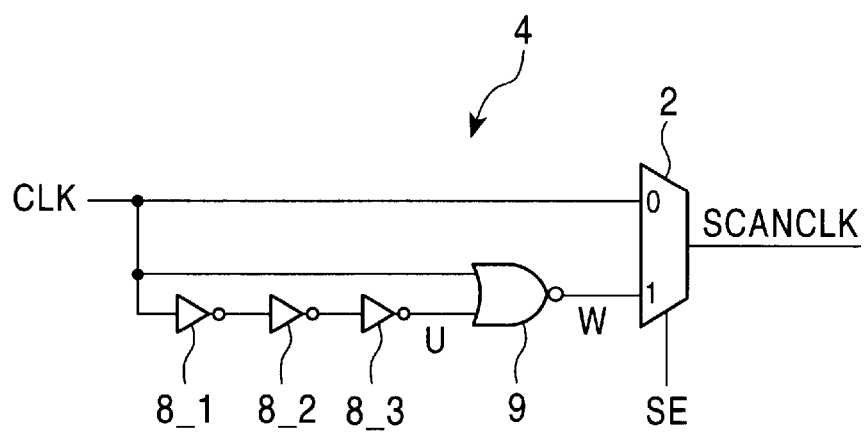
FIG. 4 illustrates another clock generator.

FIG. 4 illustrates a clock generator 4, which generates a clock having the rising edge thereof coinciding with the falling edge of the pulse of the clock CLK, like the clock a.

FIG. 4 shows a clock selector 2 in addition to the clock generator 4.

The clock generator 4 includes three inverters 8_1, 8_2, and 8_3 and a NOR gate 9.

The NOR gate 9 receives, at the inputs thereof, the clock CLK, and a signal U coming in through the three inverters. The output W of the NOR gate 9 is connected to the terminal "1" of the clock selector 2.

Figure 5:
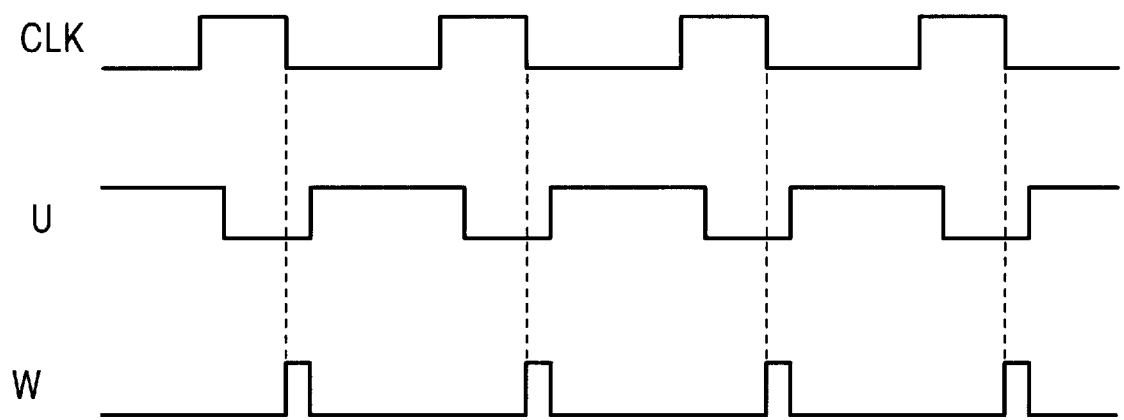
FIG. 5 is a timing diagram illustrating the timings of signals in the clock generator illustrated in FIG. 4.

FIG. 5 is a timing diagram illustrating the clock CLK, the signal U, and the signal W. Like the clock a, the signal W is a signal having the rising edge thereof coinciding with the falling edge of the clock CLK.

In the embodiments illustrated in FIGS. 1 and 4, the rising edge of the scan clock serves the operation timing of the flipflops forming the scan chain. Alternatively, the falling edge of the scan clock may serve the operation timing.

In the embodiments illustrated in FIGS. 1 and 4, the clock CLKa is selected during the shift mode while the clock CLK is selected during the capture mode. Alternatively, the clock CLK may be selected during the shift mode while the clock CLKa may be selected during the capture mode.

In the above-referenced embodiments, the clock a having the rising edge thereof coinciding with the falling edge of the clock CLK input from outside is generated, and one of the clock a and the clock CLK is selected. Alternatively, the clock selector 2 may generate one of a signal having the falling edge thereof coinciding with the rising edge of the clock CLK, a signal having the rising edge thereof coinciding with the rising edge of the clock CLK, and a signal having the falling edge thereof coinciding with the falling edge of the clock CLK, and may select the generated clock and the clock CLK. When the shift mode is switched to the capture mode, the time duration from the last clock pulse in the shift mode to the first clock pulse of the clock selected during the capture mode is set to be shorter than the period of the original clock CLK.

The clock generators generates the clock having one of the rising edge and the falling edge thereof delayed by a predetermined time from the timing of one of the rising edge and the falling edge of the clock CLK input from outside and the selector selects between the generated clock and the clock input from outside to switch between the shift mode and the capture mode. When the shift mode is switched to the capture mode, the time duration from the last clock pulse during the shift mode to the first clock pulse during the capture mode is thus set to be shorter than the period of the original clock CLK.

One such embodiment is described below.

Figure 6:
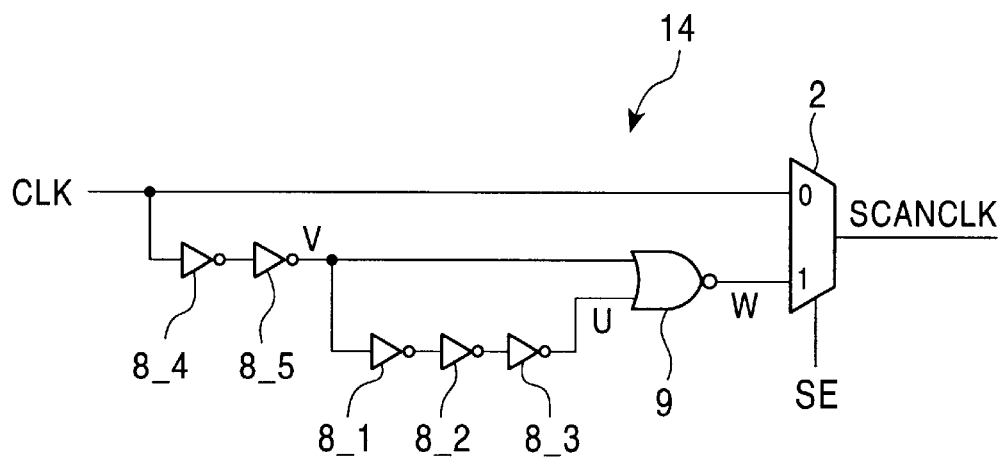
FIG. 6 illustrates yet another clock generator.

FIG. 6 illustrates yet another clock generator of the present invention. A clock generator 14 generates a clock that rises after a predetermined delay time subsequent to the timing of the falling edge of the clock CLK. FIG. 6 shows a clock selector 2 in addition to the clock generator 14.

Figure 7:
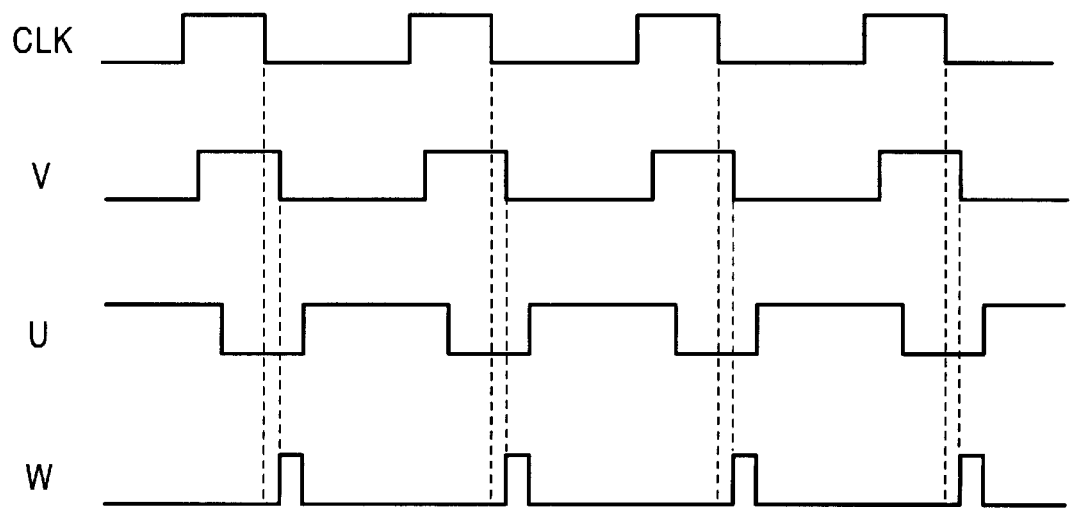
FIG. 7 is a timing diagram illustrating the timings of signals in the clock generator illustrated in FIG. 6.

The clock generator 14 includes five inverters 8_1 through 8_5 and a NOR gate. The clock generator 14 is different from the clock generator 4 shown in FIG. 4 in that two additional inverters 8_4 and 8_5 are used to delay the clock CLK, input from outside, by a predetermined time. Like components are designated with like reference numerals. FIG. 7 is a timing diagram illustrating the clock CLK, signal V, signal U, and signal W. The signal W rises after a delay time caused by the inverters 8_4 and 8_5 from the timing of the falling edge of the clock CLK, and remains high for a delay time caused by the inverters 8_1 through 8_3. The clock selector 2 selects and outputs the signal W during the shift mode and the clock CLK during the capture mode. The time duration from the rising edge of the last clock pulse in the shift mode to the rising edge of the first clock pulse in the capture mode is further shortened.

As described above, in accordance with the semiconductor device and the digital circuit of the present invention, the data that has passed through the internal circuit is fast captured subsequent to the feeding of the test data to the internal circuit even when an inexpensive and low-speed tester is used to perform a scan test. The inexpensive tester can detect a delay failure during a high-speed operation of the internal circuit. Since circuits to be added in the semiconductor device and the digital circuit are a clock generator and a clock selector only, the present invention is free from an increase in chip area and degradation in circuit performance.

What is claimed is:

1. A digital circuit comprising:
   a scan chain including a plurality of pairs of a selector and a flipflop arranged in cascade, wherein the scan chain performs a capture mode in which in response to a scan enable signal the flipflop captures data from an internal circuit in synchronization with a predetermined clock and a shift mode in which in response to the scan enable signal, one of the data stored in the flipflop and test data input from outside is shifted to a subsequent flipflop in synchronization with the predetermined clock;
   a clock generator which generates a clock signal in response to one of the rising edge and the falling edge of the clock pulse of a clock signal input from outside as a trigger; and
   a clock selector which receives the clock signal input from outside and the clock signal generated by the clock generator, and selects one of the two clock signals in response to the scan enable signal for switching between the shift mode and the capture mode, and then feeds the selected clock signal to the clock input terminal of at least one flipflop forming the scan chain.

2. A digital circuit according to claim 1, wherein the clock generator generates a clock having one of the falling edge and the rising edge thereof coinciding with one of the rising edge and the falling edge of the clock signal input from outside.

3. A digital circuit according to claim 2, wherein the clock generator comprises a type D flipflop with an input terminal thereof connected to a high-level voltage, with the clock input terminal thereof receiving an inverted version of the clock signal input from outside, and having a reset terminal, a delay circuit which delays an inverted output of the type D flipflop by a predetermined time, and an OR gate with inputs thereof receiving the clock signal input from outside and the output of the delay circuit, and with the output thereof connected to the reset terminal of the type D flipflop.

4. A digital circuit according to claim 2, wherein the clock generator is a two-input NOR gate with one input receiving the clock signal input from outside, and with the other input receiving an inverted version of a signal which is obtained by delaying the clock signal, input from outside, by a predetermined time.

5. A digital circuit according to claim 1, wherein the clock generator generates a clock having one of the falling edge and the rising edge thereof delayed by a predetermined time from the timing of one of the rising edge and the falling edge of the clock signal input from outside.

6. A digital circuit according to claim 5, wherein the clock generator is a two-input NOR gate with one input receiving a signal which is obtained by delaying the clock signal, input from outside, by a predetermined time, and with the other input receiving an inverted version of a signal which is obtained by delaying the clock signal, input from outside, by a predetermined time.

7. A semiconductor device comprising:
   a scan chain including a plurality of pairs of a selector and a flipflop arranged in cascade, wherein the scan chain performs a capture mode in which in response to a scan enable signal the flipflop captures data from an internal circuit in synchronization with a predetermined clock and a shift mode in which in response to the scan enable signal, one of the data stored in the flipflop and test data input from outside is shifted to a subsequent flipflop in synchronization with the predetermined clock;
   a clock generator which generates a clock signal in response to one of the rising edge and the falling edge of the clock pulse of a clock signal input from outside as a trigger; and
   a clock selector which receives the clock signal input from outside and the clock signal generated by the clock generator, and selects one of the two clock signals in response to the scan enable signal for switching between the shift mode and the capture mode, and then feeds the selected clock signal to the clock input terminal of at least one flipflop forming the scan chain.

8. A semiconductor device according to claim 7, wherein the clock generator generates a clock having one of the falling edge and the rising edge thereof coinciding with one of the rising edge and the falling edge of the clock signal input from outside.

9. A semiconductor device according to claim 8, wherein the clock generator comprises a type D flipflop with an input terminal thereof connected to a high-level voltage, with the clock input terminal thereof receiving an inverted version of the clock signal input from outside, and having a reset terminal, a delay circuit which delays an inverted output of the type D flipflop by a predetermined time, and an OR gate with inputs thereof receiving the clock signal input from outside and the output of the delay circuit, and with the output thereof connected to the reset terminal of the type D flipflop.

10. A semiconductor device according to claim 8, wherein the clock generator is a two-input NOR gate with one input receiving the clock signal input from outside, and with the other input receiving an inverted version of a signal which is obtained by delaying the clock signal, input from outside, by a predetermined time.

11. A semiconductor device according to claim 7, wherein the clock generator generates a clock having one of the falling edge and the rising edge thereof delayed by a predetermined time from the timing of one of the rising edge and the falling edge of the clock signal input from outside.

12. A semiconductor device according to claim 11, wherein the clock generator is a two-input NOR gate with one input receiving a signal which is obtained by delaying the clock signal, input from outside, by a predetermined time, and with the other input receiving an inverted version of a signal which is obtained by delaying the clock signal, input from outside, by a predetermined time.

13. A method of testing a semiconductor device including: a scan chain including a plurality of pairs of a selector and a flipflop arranged in cascade, wherein the scan chain performs a capture mode in which in response to a scan enable signal the flipflop captures data from an internal circuit in synchronization with a predetermined clock and a shift mode in which in response to the scan enable signal, one of the data stored in the flipflop and test data input from outside is shifted to a subsequent flipflop in synchronization with the predetermined clock;

a clock generator which generates a clock signal in response to one of the rising edge and the falling edge of the clock pulse of a clock signal input from outside as a trigger; and a clock selector which receives the clock signal input from outside and the clock signal generated by the clock generator, and selects one of the two clock signals in response to the scan enable signal for switching between the shift mode and the capture mode, and then feeds the selected clock signal to the clock input terminal of at least one flipflop forming the scan chain, the method comprising the steps of:

inputting the clock signal input from outside to the semiconductor device using a tester, and switching between the shift mode and the capture mode in response to the scan enable signal to test the semiconductor device.

* * * * *